(12) United States Patent
Toles (10) Patent No.: US 10,166,805 B2
(45) Date of Patent: Jan. 1, 2019

(54) COATED PRINT MEDIA AND METHOD FOR MAKING THE SAME

(71) Applicant: Hewlett-Packard Development Company, L.P., Fort Collins, CO (US)

(72) Inventor: Christopher Toles, San Diego, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 165 days.

(21) Appl. No.: 15/431,408

(22) Filed: Feb. 13, 2017

(65) Prior Publication Data

US 2017/0151822 A1 Jun. 1, 2017

Related U.S. Application Data

(62) Division of application No. 13/260,377, filed as application No. PCT/US2009/041572 on Apr. 23, 2009, now Pat. No. 9,944,106.

(51) Int. Cl.

| | |
|---|---|
| *B05D 3/00* | (2006.01) |
| *B41M 5/52* | (2006.01) |
| *D21H 17/67* | (2006.01) |
| *D21H 17/68* | (2006.01) |
| *D21H 19/38* | (2006.01) |
| *D21H 19/40* | (2006.01) |

(Continued)

(52) U.S. Cl.
CPC .......... *B41M 5/5218* (2013.01); *B41M 5/508* (2013.01); *C23C 16/56* (2013.01); *D21H 17/675* (2013.01); *D21H 17/68* (2013.01); *D21H 19/385* (2013.01); *D21H 19/40* (2013.01); *Y10T 428/25* (2015.01); *Y10T 428/31993* (2015.04)

(58) Field of Classification Search
CPC .... B41M 5/5218; C23C 16/56; D21H 17/675; D21H 17/68; D21H 19/385; D21H 19/40
See application file for complete search history.

(56) References Cited

U.S. PATENT DOCUMENTS

| | | | |
|---|---|---|---|
| 5,997,625 | A | 12/1999 | Londo et al. |
| 2001/0044488 | A1 | 11/2001 | Yasuda et al. |

(Continued)

FOREIGN PATENT DOCUMENTS

| | | |
|---|---|---|
| CN | 1301218 | 6/2001 |
| CN | 1446978 | 10/2003 |

(Continued)

OTHER PUBLICATIONS

International Search Report dated Jan. 18, 2010 for PCT/US2009/041572; Applicant Hewlett-Packard Development Company, L.P. et al. filed Apr. 23, 2009.

(Continued)

*Primary Examiner* — Alexander M Weddle
(74) *Attorney, Agent, or Firm* — Thorpe North & Western LLP (57) ABSTRACT

Disclosed is a coated print media having a coating layer formed on at least one surface of a media substrate. The coating layer includes a binder and co-milled particles of precipitated calcium carbonate and zeolite. The specific zeolite used is either Zeolite A or Zeolite X, or combination of both. The co-milled particles are produced by milling precipitated calcium carbonate in the presence of zeolite, whereby the co-milled particles take on the form of aggregates.

11 Claims, 3 Drawing Sheets

(51) Int. Cl.
B41M 5/50 (2006.01)
C23C 16/56 (2006.01)

(56) References Cited

U.S. PATENT DOCUMENTS

| | | |
|---|---|---|
| 2002/0040661 A1 | 4/2002 | Glaum et al. |
| 2002/0071941 A1 | 6/2002 | Tsuchida et al. |
| 2003/0008115 A1 | 1/2003 | Sugiyama et al. |
| 2003/0019399 A1* | 1/2003 | Malla .................. B41M 5/5218 106/416 |
| 2004/0034144 A1 | 2/2004 | Scharfe et al. |
| 2004/0151894 A1 | 8/2004 | Kado et al. |
| 2006/0210732 A1 | 9/2006 | Hiyama et al. |

FOREIGN PATENT DOCUMENTS

| | | |
|---|---|---|
| EP | 0818322 | 1/1998 |
| JP | 2003145923 | 5/2003 |
| WO | 9956965 | 11/1999 |

OTHER PUBLICATIONS

Dyer, Ion-Exchange Properties of Zeolites and Related Materials, Chapter 16, Institute of Materials Research, Introduction to Zeolite Science and Practice, 3rd Revised Edition, 2007, pp. 525-553.

Kosanovic et al., Thermally induced phase transformations in cation-exchanged zeolites 4A, 13X and synthetic mordenite and their amorphous derivatives obtained by mechanochemical treatment, Thermochimica Acta 317, 1998, pp. 25-37.

Garcia-Sosa et al., Cation-exchange capacities of zeolites A, X, Y, ZSM-5 and Mexican erionite compared with the retention of cobalt and cadmium, Journal of Radioanalytical and Nuclear Chemistry, vol. 250, No. 1, 2001, pp. 205-206.

Sylosive Molecular Sieve Powder Brochure, Grace Davison, 2003, W.R. Grace & Co.

Garcia-Perez et al., Influence of Cation Na/CA Ratio on Adsorption in LTA 5A: A Systematic Molecular Simulation Study of Alkane Chain Length, J. Phys. Chem. B., vol. 110, No. 47, 2006, pp. 23968-23976.

Mortensen, Zeolites, Concise Encyclopedia of Composite Materials, Elsevier, Second Edition, 2007, pp. 944.

Zaida, Zeolites as inorganic ion exchangers for environmental applications: an overview, Ion Exchange Technology II Applications, Inamuddin et al., Springer Science+Business Media B.V., 2012, p. 204.

Kamal et al., Characterization of Ink-Paper Coating Adhesion Failure: Effect of Pre-dampening of Corbonate Containing Coatings, Journal of Adhesion Science and Technology 24, 2010, pp. 449-469.

Okubo et al., The Solubility of Polyelectrolyte Complexes. Calcium Polyacrylate and the Poly(4-vinyl-N-pentylpyridinium) Salt of Poly(styrenesulfonic acid), Macromolecules, vol. 21, No. 9, 1988, pp. 2744-2747.

Petry, Expansive Clays, Geotechnical Engineering Handbook, Chapter 8, 2010.

\* cited by examiner

Zeolite A

FIG. 1

Zeolite X

COATED PRINT MEDIA AND METHOD FOR MAKING THE SAME

The present application is a divisional of U.S. patent application Ser. No. 13/260,377, filed on Sep. 26, 2011, which is a U.S. National Stage Application of PCT/US2009/041572, filed on Apr. 23, 2009, each of which is incorporated herein by reference in its entirety.

BACKGROUND

To enhance the quality of a printed image, print media are often coated with one or more coatings to promote ink transfer and/or enhance image quality. Some of these coatings incorporate inorganic pigments such as calcium carbonate and are specifically manufactured to receive ink from a printer or other printing devices. Differences in various print media characteristics are due to the differences in the type of coating used. The present disclosure relates to an improved coated print media suitable for inkjet printing and a method for making the same.

BRIEF DESCRIPTION OF THE DRAWINGS

The objects and features of the present disclosure will be better understood when considered in connection with the accompanying drawings.

DETAILED DESCRIPTION

Precipitated calcium carbonate (PCC) has been often used as a filler material in papers and paper coatings. The use of PCC in paper coatings serves to improve gloss and printability of the coated paper. However, PCC's function for creating a glossy coating is limited by its conventional large particle size (i.e., >1 µm) as sold on the market. It becomes necessary to mill (or grind) the PCC particles, in slurry form, to produce particles having a sufficiently small, sub-micron particle size. Conventional wet milling, such as bead milling using beads as the grinding medium, requires that the viscosity of the slurry be sufficiently low so that the attrition action of the beads in the bead mill is not hindered by thick fluids. As such, selective chemical dispersants, such as polyacrylates (Acumer 9300), are conventionally added to the slurry to maintain the slurry at a desirable fluidity during milling. However, when milling a slurry of PCC using a conventional bead mill, regardless of the starting dispersant level in the original slurry, as more surfaces of the PCC particles are liberated by the milling, the dispersant is insufficient to keep up with the newly liberated surfaces and the liberated calcium ions, thereby resulting in an increase in viscosity. An object of the present disclosure is to improve the viscosity performance during the grinding of the PCC-containing slurry and decreases the need for adding a large quantity of dispersant(s). Another object of the present disclosure is to provide an improved coating formulation containing milled PCC particles that is useful for print media.

Zeolites are a class of aluminosilicate minerals characterized by a large amount internal porosity, and some have significant ion exchange capacity. More specifically, Zeolites are hydrated aluminosilicates of the alkaline and alkaline-earth metals. There are more than 50 natural zeolites that have been identified, including analcime, chabazite, clinoptilolite, erionite, ferrierite, heulandite, laumontite, mordenite, and phillipsite. In addition, more than 150 zeolites have been synthesized. Natural and synthetic zeolites are used commercially because of their unique adsorption, ion-exchange, molecular sieve, and catalytic properties. Major markets for natural zeolites are pet litter, animal feed, horticultural applications (soil conditioners and growth media), and wastewater treatment. Major use categories for synthetic zeolites are catalysts, detergents, and molecular sieves.

Zeolites are made up of interlinked coordination tetrahedra of aluminum and silicon. They are usually identified by the silicon/aluminum ratio as well as the unit cell structure. These tetrahedra are linked into a number of complex shapes and "frameworks" that help define the various classes. There are 176 "Framework Types" recognized by the Internation Zeolite Association (http://www.iza-online.org/). For many zeolites, there are "extra-framework" metal cations which can be exchanged.

It has been discovered that co-milling PCC together with either Zeolite A or Zeolite X, or combination of both, significantly improves the viscosity performance during grinding, increases the particle size reduction efficiency by improving the efficiency of the milling process, and decreases the need for a large quantity of chemical dispersant(s). As used herein, the term "co-milling" refers to milling the PCC particles in the presence of Zeolite particles as grinding adjunct. Furthermore, when the co-milled PCC-Zeolite material is incorporated into coating compositions for print media, properties of the coated media are improved. Not all zeolite species work well for the intended purpose of the present disclosure, however. Zeolite A and Zeolite X are specific species of zeolite, which will now be described in detail.

Figure 1:
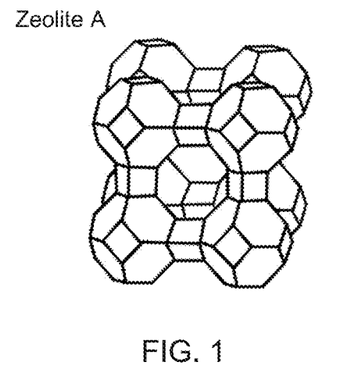
FIG. 1 schematically shows the structural framework of Zeolite A.

Zeolite A is a Linde Type A framework (LTA) zeolite that can host sodium, potassium or calcium ions as the "extra-framework" ions which defines the pore size and gives the name to the zeolite. Zeolite A has the general formula $Me^+_x[(AlO_2^-)\cdot(SiO_2)_x]$ y $H_2O$, where $Me^+$ is a cation selected from the group consisting of potassium, sodium, and calcium, x and y are numerical values representing the general ratios of the atoms. FIG. 1 schematically shows the structural framework of Zeolite A. Zeolite A has a space-group designation of Pm-3m. It has a void fraction of 0.47. Zeolite A also has a cation exchange capacity of 5.48 meq/g. There are several types of zeolite A with unique pore sizing that are useful for the intended purpose of the present disclosure:

Zeolite 3A, which has K+ as the extra-framework metal ion and ~3 Å pore

Zeolite 4A, which has Na+ as the extra-framework metal ion and ~4 Å pore

Zeolite 5A, which has Ca2+ as the extra-framework metal ion and ~5 Å pore

In a preferred embodiment, Zeolite 4A (a sodium form of a synthetic zeolite of the Linde Type A form) is used. Zeolite 4A has approximately 4 Å pore and the general chemical formula: $Na_{12}[Al_{12}Si_{12}O_{48}] \cdot 27H_2O$.

Figure 2:
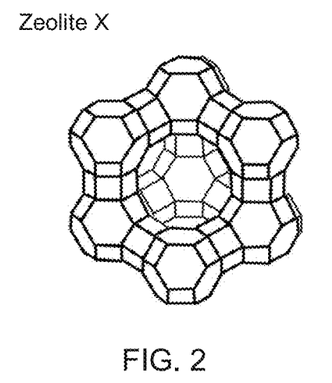
FIG. 2 schematically shows the structural framework of Zeolite X.

Zeolite X is also effective for the purpose of the present disclosure owing to its cation exchange capacity and the size of its pores. Zeolite X is a Faujasite Type (FAU) zeolite with the general formula: $Na_{87}[Al_{87}Si_{105}O_{384}] \cdot 234H_2O$. It has a void fraction of 0.5 and an approximately 7.5 Å to 8 Å pore. Zeolite X has a cation exchange capacity of 4.73 meq/g. FIG. 2 schematically shows the structural framework of Zeolite X.

Co-Milling Process

According to one embodiment, co-milled particles of PCC and Zeolite A or Zeolite X (hereafter referred to as "Zeolite") are prepared by the following steps:

(a) providing an aqueous slurry containing unground PCC particles and unground Zeolite particles, wherein the slurry has a solid concentration in the range from 10% to 30% by weight based on the total weight of the slurry and the weight ratio of PCC to Zeolite is in the range of 5:1 to 20:1, more preferably 5:1 to 10:1;

(b) subjecting the slurry to grinding in a milling device to reduce the average particle size of PCC and Zeolite, whereby the viscosity of the slurry increases as grinding continues; and (c) when the average particle size starts to increase with more grinding (due to coagulation and flocculation), adding a dispersant in an amount up to about 1% by weight based on the total weight of the slurry to lower the viscosity to a level sufficient for maintaining a consistent decrease in particle size.

Referring to steps (b) and (c) above, the viscosity level is preferably maintained at a level not higher than tenfold the starting slurry's viscosity. In a preferred embodiment, the viscosity is maintained at 500 cP or lower, more preferably, below 300 cP. Suitable dispersants include polyacrylates, and polyphosphates, but are not limited thereto. It has been determined that adding more than about 1% of the dispersant may cause flocculation ("overdispersion"), thus, it is preferred that the amount of dispersant added does not exceed this upper limit. The particle sizes of the starting (unmilled) PCC and Zeolite particles are larger than 400 nm in diameter, e.g., more than 1 μm. Commercially available, unground PCC typically has a particle size of about 2 to 4 μm, and commercially available, unground zeolite typically has a particle size of about 4 to 9 μm. The co-milled particles of PCC and Zeolite as prepared according to the above co-milling process take on the appearance of structured aggregates with a more blocky appearance than the original PCC particles. The term "aggregates" refers to clusters of several individual, finely ground particles of PCC and Zeolite that are smaller than the original, unmilled particles. The average particle size of the co-milled particles in the final slurry is less than 400 nm in diameter, preferably less than 300 nm, and more preferably 200 nm or lower. The average particle size of the co-milled particles refers to average particle size of the aggregates resulted from co-milling.

Figure 3:
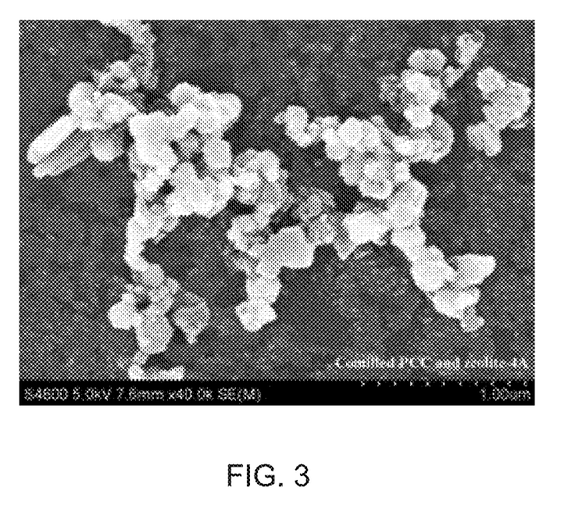
FIG. 3 is a scanning electron micrograph (SEM) image of co-milled precipitated calcium carbonate and Zeolite 4A according to an embodiment of the present disclosure.
Figure 4:
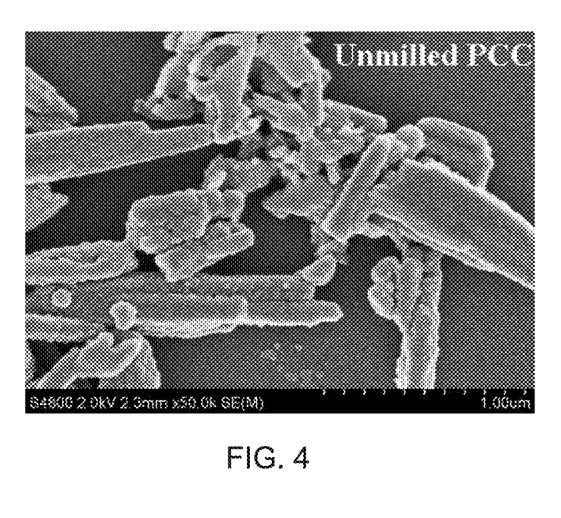
FIG. 4 is a SEM image of unmilled precipitated calcium carbonate.
Figure 5:
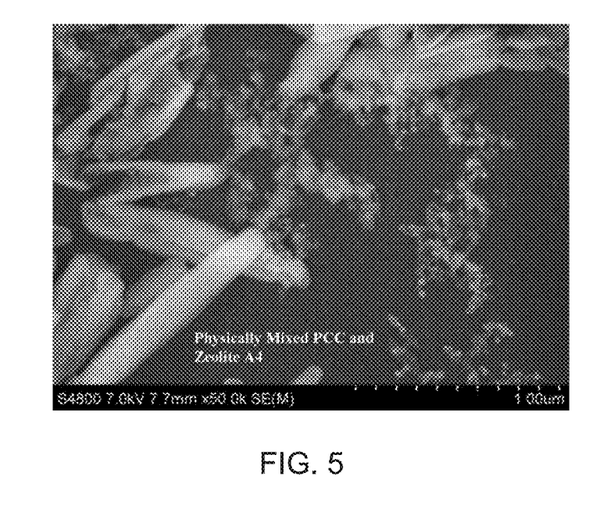
FIG. 5 is a SEM image of a mixture of unmilled precipitated calcium carbonate and unmilled Zeolite 4A particles.

FIG. 3 is a scanning electron micrograph (SEM) image of the co-milled PCC and Zeolite 4A particles produced according to the milling process disclosed above. Shown for comparison, FIG. 4 is a SEM image of un-milled PCC particles. The co-milled PCC and Zeolite 4A particles take on the appearance of structured aggregates with a more blocky appearance than the original un-milled PCC. FIG. 5 is a SEM image of a mixture of unmilled PCC and unmilled Zeolite 4A particles (prepared by physically mixing the particles without milling). By comparing FIG. 3 and FIG. 5, it can be clearly seen that the mixed, unmilled PCC and Zeolite 4A particles are structurally different from the co-milled aggregates shown in FIG. 3.

The present disclosure is also directed to an improved print media having a coating layer containing the co-milled particles of PCC and Zeolite, which have been prepared according to the co-milling method described above. This coating layer is formed by applying an aqueous coating composition (in liquid form) onto one or both opposing surfaces of a media substrate, and subsequently drying the coating composition. The resulting coating layer is useful as an ink-receiving layer on the print media.

Coating Composition

An aqueous coating composition is formed by admixing the PCC-Zeolite slurry produced from the co-milling process described above with a binder and other additives to produce a cohesive coating layer. The aqueous coating composition has the following formulation, in dry parts: 100 parts of co-milled PCC and Zeolite particles, the weight ratio of PCC to Zeolite being in the range of 5:1 to 20:1, more preferably 5:1 to 10:1; from 5 to 15 parts of at least one binder; and from 0 to 50 parts of additional coating additives. A liquid carrier, preferably water, is added as necessary to this formulation to produce a coating liquid with a desirable solid content and fluidity suitable for application using conventional coating techniques.

Suitable binders for the aqueous coating composition include, but are not limited to, polyvinyl alcohol and derivatives thereof, styrene-butadiene emulsion, acrylonitrile-butadiene latex, oxidized starch, cationized starch, esterified starch, enzymatically denatured starch and the like, gelatin, casein, soybean protein, cellulose derivatives including carboxy-methyl cellulose, hydroxyethyl cellulose and the like, acrylic emulsion, vinyl acetate emulsion, vinylidene chloride emulsion, polyester emulsion, polyvinylpyrrolidone, polyurethanes, polyamide resins, and combinations thereof.

Additional coating additives for the aqueous coating composition include conventional additives such as surfactants, defoamers, humectant, dispersing agents, biocides, UV/light protectants, fade-control agents, fillers, preservatives (e.g. anti-oxidants), buffers, pH modifiers, slip agents, stabilizers, ink fixatives, cross-linking agents, and combinations thereof without restriction.

In some embodiments, the pH of the slurry containing the co-milled PCC and Zeolite material may need to be adjusted before incorporating the slurry into the coating composition if the pH is too high, e.g. 12 or greater. Alternatively, the pH of the coating composition may be adjusted after the co-milled PCC and Zeolite material has been incorporated into the coating composition. The pH should be adjusted to no less than about 8; preferably, the pH is adjusted to about 9 to 9.5. The pH may be adjusted using any suitable acid, e.g. acetic acid, or any suitable buffer, e.g. a sodium carbonate/sodium bicarbonate buffer system.

Media Substrate

The media substrate of the improved coated media may take the form of a media sheet or a continuous web suitable for use in an imaging device such as an inkjet printer. The media substrate may be a paper base manufactured from cellulose fibers. More specifically, the paper base may be produced from chemical pulp, mechanical pulp, thermal mechanical pulp and/or the combination of chemical and mechanical pulp. The paper base may also include conventional additives such as internal sizing agents and fillers. The internal agents are added to the pulp before it is converted into a paper web or substrate. They may be chosen from conventional internal sizing agents for printing papers. The fillers may be any particular types used in conventional paper making. As a non-limiting example, the fillers may be selected from calcium carbonate, talc, clay, kaolin, titanium dioxide and combinations thereof. Other applicable substrates include cloth, nonwoven fabric, felt, and synthetic (non-cellulosic) papers. The media substrate may be an uncoated raw paper base or a pre-coated paper base. As discussed above, the coating layer containing the co-milled PCC-Zeolite material is useful as the ink-receiving layer on the print media. It shall be understood that one or more intermediate layers may be formed between such ink-receiving layer and the media substrate (whether coated or uncoated).

Production of Coated Media

A number of conventional coating techniques may be utilized to apply the aqueous coating composition described above onto the media substrate. Representative techniques include size press coating, slot die coating, curtain coating, blade coating, roller coating, Meyer rod coating, air knife coating, gravure application, air brush application, and spraying. Suitable size presses include puddle-sized press, film-sized press and the like. The puddle-sized press may be configured to have horizontal, vertical, or inclined rollers. The film-sized press may include a metering system, such as gate-roll metering, blade metering, Meyer rod metering, or slot metering. The coating composition may be applied to the paper substrate using an off-line or on-line coater. As an example, the coating composition may be applied to a paper base by an on-line size press during the surface sizing stage of a papermaking process. After coating, the coated media substrate is dried using any suitable drying method such as hot air or convection drying, conduction drying, or radiant-energy drying such as infrared heating.

After coating and drying, the coated media substrate may be further calendered using a conventional calendering machine with rollers in order to increase the glossiness of the coating. The calendering machine may be a separate super-calendering machine, an on-line, soft-nip calendering machine, or an off-line, soft-nip calendering machine.

It has been discovered that having a coating containing the co-milled PCC-Zeolite material as the ink-receiving layer improves the ink solvent absorption rate during printing, without reducing print quality, as compared to having a coating with only milled PCC (without zeolite). In addition, the coating containing the co-milled PCC-Zeolite material is less yellow and glossier than a coating with only milled PCC.

EXAMPLES

The following Examples will serve to illustrate representative embodiments of the present disclosure and should not be construed as limiting of the disclosure in any way. All parts and % referred to herein are dry parts and weight % unless otherwise indicated.

Example 1

Co-Milling of Precipitated Calcium Carbonate and Zeolite 4A

A starting slurry of precipitated calcium carbonate and zeolite 4A was loaded into a Netzsch Mini Pur bead mill equipped with an approximately 200 ml grinding chamber, lined with polyurethane (Netzsch USA). The slurry had the following formulation:

433.9 g Opacarb A40 slurry (available from Specialty Minerals, New York) (29.7 wt % PCC, initial particle size of 2-4 μm)

25.8 g Zeolite 4A powder (Sylosiv brand from Grace Davidson) (initial particle size of 6-9 μm)

255.5 g Deionized water

The measured solid content of the slurry was 19%.

The slurry material, as initially mixed, started with a Brookfield viscosity at 100 rpm of approximately 6 cP. After approximately 1 hour of milling, the particle size of co-milled particles (i.e. aggregates) was reduced to 345 nm and the viscosity has increased to 28 cP (100 rpm). With continued grinding, the viscosity increased further to 231 cP and the particle size started to increase. At this point Acumer 9300 (a polyacrylate dispersant available from Rohm and Hass) was added in an attempt to keep the viscosity below 300 cP and to maintain a consistent decrease in particle size. This required the sum total addition of 3.6 g of Acumer 9300 to achieve a final particle size of 260 nm after 3 hours and 48 minutes of milling.

Comparative Example 2

Milling Without Zeolite

The same type of grinding was done in the same equipment as in EXAMPLE 1 except that, in this case, the Opacarb A40 slurry was diluted to 19% total solid content to match the solid content of EXAMPLE 1 and no Zeolite 4A was added.

The initial viscosity of the slurry was 119 cP (at 100 rpm). After 30 minutes of grinding the viscosity climbed to 231 cP while the PCC particle size was at nearly 4 μm. At this point, significant amount of additional dispersant (Acumer 9300, a polyacrylate dispersant) was added. Ultimately, it required the addition of 6.4 g of Acumer 9300 to maintain a sufficiently low viscosity to continue the grinding. After 5 hours and 20 minutes the particle size finally fell to 270 nm.

For the same grinding time period, the Brookfield viscosity at 100 rpm of the slurry containing the co-milled PCC-Zeolite material can be maintained at less than 50% of the viscosity of milled PCC alone (without Zeolite). The amount of dispersant required during grinding is reduced by more than half when Zeolite is present.

Example 3

Preparation of Coated Paper Samples

Coating samples were made using the dispersions from EXAMPLE 1 and had the following formulation:

100 dry parts PCC co-milled with Zeolite 4A 10 parts polyvinyl alcohol (Mowiol 40-88, Clariant Corp, North Carolina)

1 part Glycerol 0.3 parts fluorosurfactant (Polyfox PF 151N, Omnova Solutions, Ohio)

The coating samples were applied onto paper sheets using a #40 Meyer rod (4 replicates, 3 measurements each). The coated sheets were calendered at 2000 psi/110° F., 3 passes against a heated, chrome calendar roller. The final average gloss value was measured to be 25.6 at 60° gloss.

Example 4

Three slurry samples were made with varying amounts of Zeolite 4A added into the PCC slurry. In this case, Zeolite 4A available from Chalco Aluminum, Shandong, China, was used. The formulations of the three slurry samples are shown in Table 1.

TABLE 1

| Sample ID | Amount (g) Opacarb A4 Slurry | % Solids PCC Slurry | Amount (g) Zeolite 4A added |
|---|---|---|---|
| 6257-30A | 409.8 | 29.58% | 12.28 |
| 6257-30B | 409.8 | 29.58% | 6.24 |
| 6257-30C | 409.8 | 29.58% | 0 |

The samples were ground in the Netzsch MiniPur bead mill for several hours and approximately every hour the viscosity was measured using a Brookfield viscometer (at 100 rpm).

Figure 6:
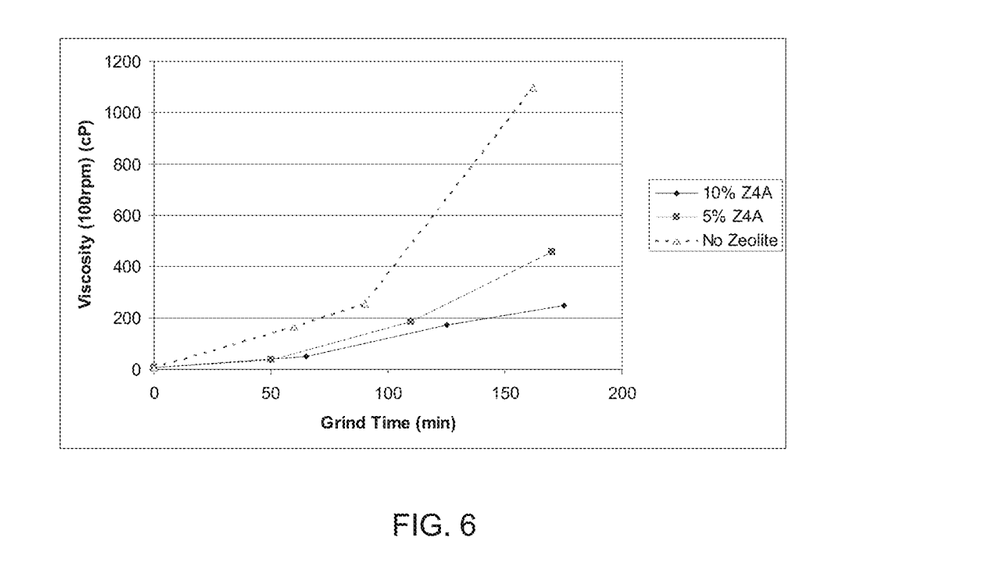
FIG. 6 shows the relative rates of increase in viscosity based on the different amounts of Zeolite 4A added to a slurry containing precipitated calcium carbonate during milling.

FIG. 6 shows the relative rates of increase of viscosity as compared to the amount of Zeolite 4A added during the first three hours the milling process of Example 4.

Example 5

Coating Optical Quality

Three coating formulations were made using unmilled precipitated calcium carbonate (Opacarb A40), nano-milled precipitated calcium carbonate, and co-milled precipitated calcium carbonate and Zeolite 4A according to the formulations shown in Table 2.

TABLE 2

| | Coating ID | |
|---|---|---|
| | Lacq6257-19 Milled PCC + Zeolite | Lacq6257-23 Milled PCC Only |
| PCC ± Zeolite Slurry | 100 | 100 |
| Polyvinyl alcohol | 10 | 10 |
| Fluorosurfactant | 0.3 | 0.3 |

The coating formulations were coated onto a polyethylene-extrusion coated photobase paper (a conventional photo paper) using a #65 Meyer rod. The samples were then measured using an X-Rite Spectrodensitometer colorimeter to assess L*a*b* values (a color coding system developed by Commission Internationale de L'Éclairage (CIE)) The CIELAB color space is a colorimetric space that seeks to describe the colors visible to the human eye and act as a "device independent" model for reference. This color space is made up of three coordinates; L* (0=black, 100% diffuse white), a* (<0=green, >0=magenta), and b* (<0=blue, >0=yellow)

The milled PCC-only coating visibly looked more yellow and this was reflected in the b* value that was statistically higher than that for the PCC+Zeolite and the unmilled PCC-only coatings as can be seen in Table 3.

TABLE 3 b* values for EXAMPLE 5 coatings
(less negative value means more yellow color)

| Coating ID | Average b* | 95% Confidence Interval |
|---|---|---|
| Lacq 6257-19 | −5.8 | ±0.08 |
| Lacq 6257-23 | −1.8 | ±0.08 |

Example 6

Print Performance

The coated paper sheets made in EXAMPLE 3 were printed with a pigment ink using a Hewlett-Packard inkjet printer. Comparative coated paper sheets were made according to the method of EXAMPLE 3 except that 100 parts of milled PCC only was used in the coating formulation, and these sheets were subsequently printed using the same inkjet printer. The printed sheets were compared against a commercially available printed, glossy brochure media. The results are shown below in Table 4. Color gamut is measured as the volume of the CIE L*a*b* space based on the X-Rite colorimetry measurement of 8 color blocks printed on the paper. Coalescence (graininess level) is measured by a visual ranking scale with 5 being the best (no coalescence) and 1 being the worst.

TABLE 4

Print performance for PCC co-milled with zeolite versus a control of PCC milled by itself

| Slurry Sample | Relative Color Gamut (Volume normalized to "Control") | Coalescence Visual ranking (5 = best, 1 = worst) |
|---|---|---|
| Control | 1 | 3 |
| Co-Milled PCC + Zeolite | 1.05 | 2 |
| Milled PCC (only) | 1.03 | 2 |

It is apparent from Table 4 that the coating sample of co-milled PCC and Zeolite provides an improvement in color gamut as compared to the coating sample with PCC only, and comparable coalescence level.

Example 7

Ink Absorption

The coated paper samples from EXAMPLE 3 were analyzed using a Bristow Wheel ink absorption tester (as described in Bristow, J. A., 1967, Liquid absorption into paper during short time intervals, *Svensk Paperstidning*, v70, pp623-629). In this Bristow test, a special type of ink jet head box is initially filled with a metered amount of the fluid under study. This head box is then placed in contact with the porous ink-receiving surface under study, and this surface is attached to a rotating wheel. By measuring the length of an ink trace for a number of different wheel speeds, a plot of the amount of fluid transferred into the porous material versus the time that the ink jet head box is in contact with the porous material can be developed for each of the wheel speeds. From this information, three parameters relating to the fluid penetration dynamics may be obtained, namely: (1) the volumetric roughness of the print medium, (2) the wetting delay of fluid penetration into the print medium and (3) the fluid penetration rate into the print medium. The samples with Zeolite 4A absorbed ink significantly faster as evidenced by much shorter ink traces at all speeds. The absorption coefficient (Ka) calculated from linear least squares fits to the two data sets reveals that the sample with Zeolite 4A has a Ka=55.1 while the Ka for the PCC-only sample is only 5.1.

Comparative Example 8

Co-Milling with a Different Zeolite (Clinoptilolite)

A starting slurry of precipitated calcium carbonate and a calcium-containing zeolite (Clinoptilolite) was loaded into a Netzsch Mini Pur bead mill equipped with an approximately 200 ml grinding chamber, lined with polyurethane (Netzsch USA). The slurry had the following formulation:

300 g Opacarb A40 slurry (available from Specialty Minerals, New York) (30 wt % PCC)
    36 g Clinoptilolite (zeolite) powder (available from St. Cloud Zeolite, New Mexico, U.S.)

The measured solid content of the slurry was approximately 30%.

The slurry material, as initially mixed, started with a Brookfield viscosity at 100 rpm of less than 5 cP. After approximately 110 minutes of milling, the viscosity had increased to 400 cP (at 100 rpm). With continued grinding of 25 minutes, the viscosity increased further to 845 cP. This is approximately twice the viscosity of PCC co-milled with the preferred Zeolite 4A as seen in Example 1.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a weight range of approximately 1 wt % to about 20 wt % should be interpreted to include not only the explicitly recited concentration limits of 1 wt % to about 20 wt %, but also to include individual concentrations such as 2 wt %, 3 wt %, 4 wt %, and sub-ranges such as 5 wt % to 15 wt %, 10 wt % to 20 wt %, etc.

Although the present disclosure describes certain representative embodiments and examples, it will be understood to those skilled in the art that various modifications may be made to these representative embodiments and examples without departing from the scope of the appended claims.

What is claimed is:

1. A method of forming a coated print media comprising:
   (a) providing an aqueous starting slurry containing unground precipitated calcium carbonate particles and unground zeolite particles, wherein said zeolite is selected from the group consisting of Zeolite A, Zeolite X, and combination thereof;
   (b) subjecting the starting slurry to grinding in a milling device to reduce the average particle size of precipitated calcium carbonate and zeolite, whereby grinding unground particles of precipitated calcium carbonate and zeolite produces co-milled particles which take on the form of aggregates, and the viscosity of the slurry increases as grinding continues;
   (c) when the average particle size starts to increase with more grinding, adding a dispersant in an amount up to about 1% by weight based on the total weight of the slurry to lower the viscosity to a level sufficient for maintaining a consistent decrease in particle size;
   (d) preparing an aqueous coating composition which comprises said co-milled particles of precipitated calcium carbonate and zeolite and at least one binder;
   (e) applying said coating composition onto at least one surface of a media substrate; and
   (f) drying said coating composition.

2. The method of claim 1, wherein said zeolite is Zeolite A and is selected from the group consisting of Zeolite 3A, Zeolite 4A, and Zeolite 5A.

3. The method of claim 2, wherein said zeolite is Zeolite 4A having the general formula: $Na_{12}[Al_{12}Si_{12}O_{48}] \cdot 27H_2O$.

4. The method of claim 1, wherein the weight ratio of precipitated calcium carbonate to zeolite in the starting slurry is in the range of 5:1 to 20:1.

5. The method of claim 1, wherein the weight ratio of precipitated calcium carbonate to zeolite in the starting slurry is in the range of 5:1 to 10:1.

6. The method of claim 1, wherein after drying said coating composition, the coating composition is in the form of a coating layer comprising 100 dry parts of said co-milled particles of precipitated calcium carbonate and zeolite and 5 to 15 parts of said binder.

7. The method of claim 1, wherein the average particles size is 200 nm or less.

8. The method of claim 1, wherein the media substrate is a paper substrate containing cellulose fiber.

9. The method of claim 1, wherein the starting slurry has a solid concentration in the range from 10% to 30% by weight based on the total weight of the slurry.

10. The method of claim 1, wherein the unground precipitated calcium carbonate particles and unground zeolite particles in the starting slurry have particle sizes that are greater than 1 μm, and grinding is carried out according to steps (b) and (c) until the co-milled particles have an average particle size of less than 400 nm.

11. The method of claim 1, wherein the viscosity of the slurry during grinding according to steps (b) and (c) does not exceed tenfold the viscosity of the starting slurry.

\* \* \* \* \*

UNITED STATES PATENT AND TRADEMARK OFFICE
CERTIFICATE OF CORRECTION

PATENT NO. : 10,166,805 B2
APPLICATION NO. : 15/431408
DATED : January 1, 2019
INVENTOR(S) : Christopher Toles

Page 1 of 1

It is certified that error appears in the above-identified patent and that said Letters Patent is hereby corrected as shown below:

In the Claims

In Column 10, Line 30, Claim 6, delete "to15" and insert -- to 15 --, therefor.

Signed and Sealed this
Ninth Day of April, 2019

Andrei Iancu
*Director of the United States Patent and Trademark Office*